(12) United States Patent
Huang

(10) Patent No.: US 11,817,165 B2
(45) Date of Patent: Nov. 14, 2023

(54) SIGNAL GENERATION CIRCUIT AND METHOD, AND SEMICONDUCTOR MEMORY

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 249 days.

(21) Appl. No.: 17/447,424

(22) Filed: Sep. 11, 2021

(65) Prior Publication Data
US 2023/0005558 A1  Jan. 5, 2023

Related U.S. Application Data

(63) Continuation of application No. PCT/CN2021/107078, filed on Jul. 19, 2021.

(30) Foreign Application Priority Data

Jul. 2, 2021 (CN) .......................... 202110751390.6

(51) Int. Cl.
- *G11C 29/12* (2006.01)
- *G11C 29/44* (2006.01)
- *H03L 7/099* (2006.01)
- *H03L 7/08* (2006.01)

(52) U.S. Cl.
CPC .... *G11C 29/12015* (2013.01); *G11C 29/4401* (2013.01); *H03L 7/0805* (2013.01); *H03L 7/0992* (2013.01); *H03L 7/0995* (2013.01)

(58) Field of Classification Search
CPC .......... G11C 29/12015; G11C 29/4401; G11C 29/028; G11C 29/20; G11C 29/24; G11C 29/022; H03L 7/0805; H03L 7/0992; H03L 7/0995; H03K 3/0315
USPC ........................................................ 365/201
See application file for complete search history.

(56) References Cited

U.S. PATENT DOCUMENTS

2008/0094055 A1* 4/2008 Monreal .................. G01D 3/02
                                                      324/117 H
2008/0116951 A1* 5/2008 Wu ........................ H03L 7/0816
                                                      327/161

FOREIGN PATENT DOCUMENTS

CN           109144848 B * 6/2021 .......... G06F 11/3608

* cited by examiner

*Primary Examiner* — Fernando Hidalgo
(74) *Attorney, Agent, or Firm* — SYNCODA LLC; Feng Ma

(57) ABSTRACT

A signal generation circuit includes: a clock circuit configured to receive a flag signal and generate a clock signal; a control circuit configured to generate a control circuit; and a generation circuit connected to both the clock circuit and control circuit and configured to receive the clock signal, the control signal, and the flag signal and generate a target signal, wherein when the flag signal changes from a first level to a second level, the target signal changes from a third level to a fourth level, and after the target signal is maintained at the fourth level for a target duration, the target signal changes from the fourth level to the third level; and the generation circuit is further configured to determine the target duration according to the clock signal and control signal.

20 Claims, 4 Drawing Sheets

SIGNAL GENERATION CIRCUIT AND METHOD, AND SEMICONDUCTOR MEMORY

CROSS-REFERENCE TO RELATED APPLICATIONS

This application is a continuation of International Patent Application No. PCT/CN2021/107078 filed on Jul. 19, 2021, which claims priority to Chinese Patent Application No. 202110751390.6 filed on Jul. 2, 2021. The disclosures of these applications are hereby incorporated by reference in their entirety.

BACKGROUND

A semiconductor memory may include a volatile memory (such as a Dynamic Random-Access Memory (DRAM) or a static random-access memory) and a non-volatile memory (such as a flash memory, a phase-change memory, a ferroelectric memory, a magnetic memory, or a resistive memory). Generally, the volatile memory supports high-speed random access, and is often used as the main memory of a computing system (such as a personal computer, a server, or a workstation).

SUMMARY

The present disclosure relates to, but is not limited to, a signal generation circuit and method, and a semiconductor memory.

In a first aspect, embodiments of the present disclosure provide a signal generation circuit, including: a clock circuit, configured to receive a flag signal and generate a clock signal; a control circuit, configured to generate a control signal, trend of a change of cycle of the clock signal with a process and trend of a change of a target value represented by the control signal with the process being opposite; and a generation circuit, connected to both the clock circuit and the control circuit, and configured to receive the clock signal, the control signal, and the flag signal and generate a target signal, wherein when the flag signal changes from a first level to a second level, the target signal changes from a third level to a fourth level, and after the target signal is maintained at the fourth level for a target duration, the target signal changes from the fourth level to the third level; and the generation circuit is further configured to determine the target duration according to the clock signal and the control signal.

In a second aspect, embodiments of the present disclosure provide a signal generation method, including: receiving, by a clock circuit, a flag signal, generating a clock signal, and outputting the clock signal to a generation circuit; generating, by a control circuit, a control signal, and outputting the control signal to the generation circuit, trend of a change of cycle of the clock signal with a process and trend of a change of a target value represented by the control signal with the process being opposite; and receiving, by the generation circuit, the clock signal, the control signal, and the flag signal, and generating a target signal, wherein when the flag signal changes from a first level to a second level, the target signal changes from a third level to a fourth level, and after the target signal is maintained at the fourth level for a target duration, the target signal changes from the fourth level to the third level; and the target duration is determined by the generation circuit according to the clock signal and the control signal.

In a third aspect, embodiments of the present disclosure provide a semiconductor memory, including the signal generation circuit according to any one of the embodiments in the first aspect.

BRIEF DESCRIPTION OF THE DRAWINGS

In accompanying drawings, unless otherwise specified, the same reference numerals throughout multiple accompanying drawings denote the same or similar components or elements. These accompanying drawings are not necessarily drawn in proportion. It should be understood that these accompanying drawings only depict some implementations disclosed according to the present disclosure, and should not be regarded as limiting the scope of the present disclosure.

DETAILED DESCRIPTION

Figure 1:
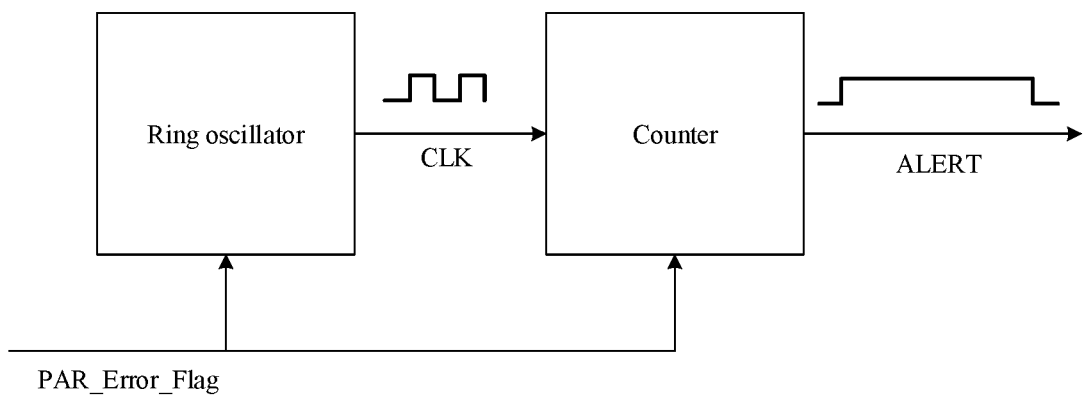
FIG. 1 shows a parity check alert circuit of a DDR4 chip.

Exemplary implementations disclosed in the present disclosure will be described in more detail below with reference to accompanying drawings. Although the accompanying drawings show exemplary implementations of the present disclosure, it should be understood that the present disclosure can be implemented in various forms and should not be limited by the specific implementations set forth here. On the contrary, these implementations are provided for a more thorough understanding of the present disclosure and to fully convey the scope of the disclosure of the present disclosure to persons skilled in the art.

In the following description, a lot of specific details are given in order to provide a more thorough understanding of the present disclosure. However, it is apparent to persons skilled in the art that the present disclosure can be implemented without one or more of these details. In other examples, to avoid confusion with the present disclosure, some of the technical features well known in the art are not described. That is, all the features of actual embodiments are not described herein, and well-known functions and structures are not described in detail.

In addition, the accompanying drawings are only schematic illustrations of the present disclosure, and are not necessarily drawn in proportion. The same reference numerals in the drawings denote the same or similar parts, and thus, the repeated descriptions thereof will be omitted. Some of the block diagrams shown in the accompanying drawings are functional entities, and do not necessarily correspond to physically or logically independent entities. These functional entities can be implemented in the form of software, or implemented in one or more hardware modules or integrated circuits, or implemented in different networks and/or processor apparatuses and/or microcontroller apparatuses.

The flowchart shown in an accompanying drawing is only an exemplary description, and does not necessarily include all steps. For example, some of the steps can be decomposed, while some of the steps can be combined or partially combined, and therefore, the actual execution order may be changed according to actual situations.

The purpose of the terms used herein is only to describe specific embodiments and not as a limitation of the present disclosure. When used herein, the singular forms "a", "one", and "the/this" are also intended to include plural forms, unless the context clearly indicates otherwise. It should also be understood that the terms "composition" and/or "including", when used in this description, determine the existence of the described features, integers, steps, operations, elements, and/or components, but do not exclude the existence or addition of one or more other features, integers, steps, operations, elements, components, and/or groups. When used herein, the term "and/or" includes any and all combinations of related listed items.

In a manufacturing process of semiconductor memories, the manufactured semiconductor memories have different process corners due to the position difference on a same wafer, or the difference in the parameters of field-effect transistors between different batches of wafers. Therefore, the clock signal generated by a ring oscillator in the semiconductor memory will change with the change of a process, and the signal controlled by this clock signal will also change with the process. As a result, the signal controlled by this clock signal in different semiconductor memories will have a certain error from an expected value in different process corners, and may even exceed a standard requirement.

In the specification (SPEC) of a DDR4 chip, the pulse width tPAR_ALERT_PW of a ALERT signal output by a command/address (C/A) bus parity check alert system is specified between 60 ns and 120 ns. FIG. 1 shows a parity check alert circuit of a DDR4 chip. In this circuit design, after a parity check error occurs, a PAR_Error_Flag signal is output to enable a ring oscillator, so that the ring oscillator generates a clock signal CLK with a fixed cycle of T'. Then the stage N' of a counter is determined according to the SPEC requirement of tPAR_ALERT_PW. Through this circuit design, the parity check alert circuit outputs logic 1 when receiving the PAR_Error_Flag signal, and then outputs logic 0 after the counting of the counter ends, and the final result is the pulse width of the output ALERT signal tPAR_ALERT_PW=T'×N', T' being the cycle of the clock signal generated by the ring oscillator, and N' being the stage of the counter.

Figure 2:
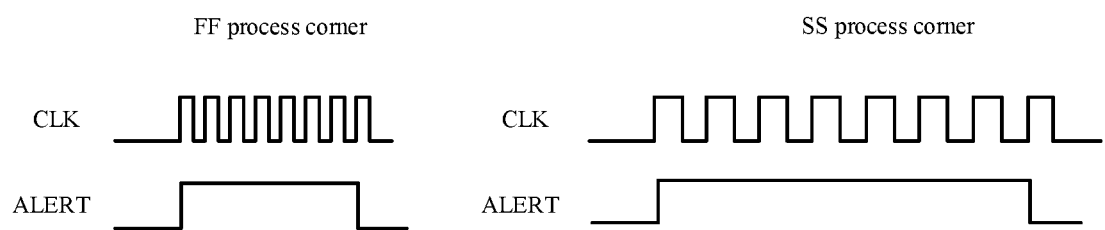
FIG. 2 is a schematic diagram of the pulse width variation of an ALERT signal in different processes.

However, although the pulse width of the ALERT signal output in this circuit design does not change with the change of the operating frequency of the chip, it will change with the change of a process. In a manufacturing process of semiconductor devices, due to the position difference on a same wafer, or the difference in the parameters of field-effect transistors between different batches of wafers, there will be variations. Such variations are called process corners. The process corners are generally divided into three process corners, i.e., slow-slow (SS), typical-typical (TT), and fast-fast (FF). FIG. 2 shows a pulse width variation of an ALERT signal in different process corners. As shown in FIG. 2, in the case of a particularly large process variation, the cycle T' of a clock signal CLK generated by a ring oscillator will be very different. For example, in an FF process corner, the cycle T' of the clock signal CLK generated by the ring oscillator is relatively small, while in an SS process corner, the cycle T' of the clock signal CLK generated by the ring oscillator is relatively large. Under the amplification of the stage N' of a counter, finally the pulse width tPAR_ALERT_PW of a ALERT signal in the SS process corner would easily exceed the 60 ns-120 ns range specified by the SPEC, while the pulse width tPAR_ALERT_PW of the ALERT signal in the FF process corner would also be easily smaller than the 60 ns-120 ns range specified by the SPEC.

In view of the above, the following technical solutions of embodiments of the present disclosure are proposed.

Figure 3:
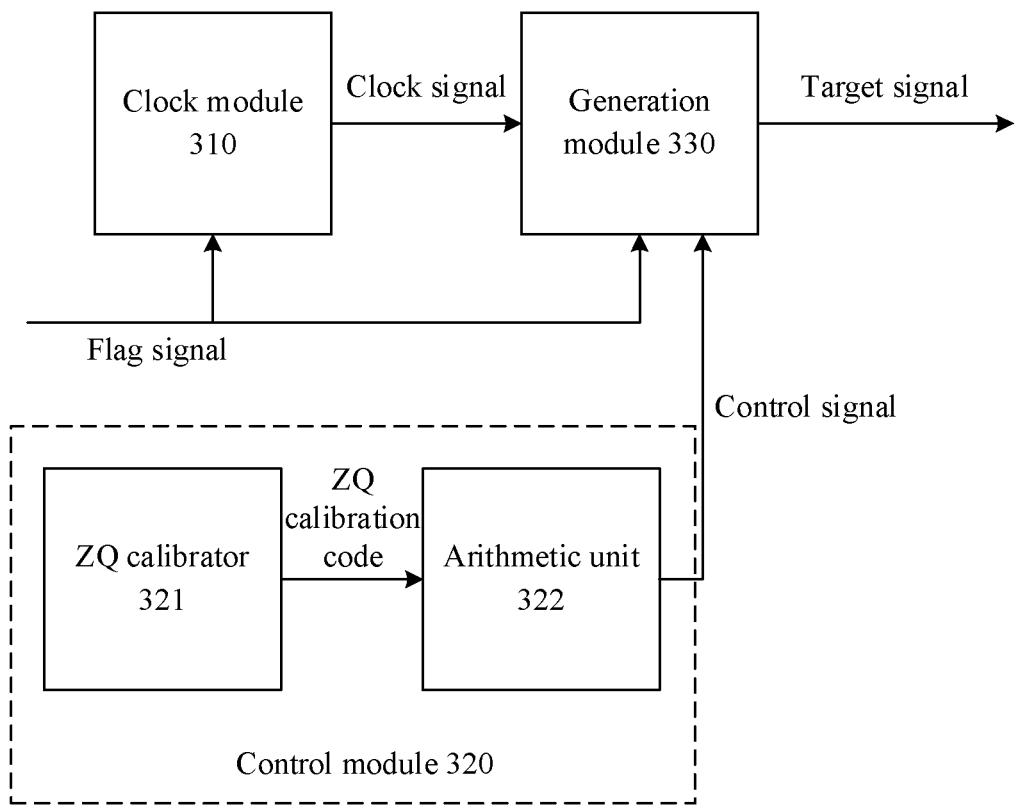
FIG. 3 is a schematic structural diagram of a signal generation circuit provided by embodiments of the present disclosure.

Embodiments of the present disclosure provide a signal generation circuit. FIG. 3 is a schematic structural diagram of a signal generation circuit provided by embodiments of the present disclosure. As shown in FIG. 3, the circuit includes:

a clock module 310, configured to receive a flag signal and generate a clock signal;

a control module 320, configured to generate a control signal, trend of a change of cycle of the clock signal with a process and trend of a change of a target value represented by the control signal with the process being opposite; and a generation module 330, separately connected to the clock module 310 and the control module 320, and configured to receive the clock signal, the control signal, and the flag signal and generate a target signal, wherein when the flag signal changes from a first level to a second level, the target signal changes from a third level to a fourth level, and after the target signal is maintained at the fourth level for a target duration, the target signal changes from the fourth level to the third level; and the generation module 330 being further configured to determine the target duration according to the clock signal and the control signal.

Here, the target duration in which the target signal output by the generation module 330 is maintained at the fourth level is the pulse width of the target signal output by the generation module 330.

In the embodiments of the present disclosure, the trends of the changes of the target value represented by the control signal and the cycle of the clock signal with the process are opposite, so that the target duration determined according to the clock signal and the control signal will not be affected by the process, so that the pulse width of the target signal is stable.

Further, in the embodiments of the present disclosure, the pulse width of the target signal is adjusted through the clock signal and the control signal to control the pulse width of the target signal within a certain range, so as to reduce or eliminate the change of the pulse width of the target signal with the process, thereby stabilizing the pulse width of the target signal.

The embodiments of the present disclosure provide a signal generation circuit, configured to generate a target signal and adjust the pulse width of the target signal to stabilize same within a certain range. This signal generation circuit can be widely used in semiconductor memories, such as DDR2, DDR3, DDR4, LPDDR2, and LPDDR3, which will not be listed here.

The clock module 310 provided by the embodiments of the present disclosure includes a ring oscillator. When the flag signal changes from the first level to the second level, the ring oscillator generates the clock signal. In the embodiments of the present disclosure, the ring oscillator is used to generate the clock signal as an internal clock signal.

In the embodiments of the present disclosure, the control module 320 includes a ZQ calibrator 321 and an arithmetic unit 322, where the ZQ calibrator 321 is configured to perform a ZQ calibration operation and output a ZQ calibration code used for calibrating output impedance; and the arithmetic unit 322 is configured to receive the ZQ calibration code, divide a coefficient by the ZQ calibration code and output a division result as the control signal. In the embodiments of the present disclosure, the control signal is obtained by dividing the coefficient by the ZQ calibration code.

An output drive circuit is provided in the memory chip of a DRAM memory and configured to output a data signal externally when the DRAM memory performs a read operation. The output impedance of the output drive circuit will affect the quality of the output data signal. In addition, an On-Die Termination (ODT) resistor is generally provided in the memory chip of the DRAM memory to reduce the reflection of the signal at a terminal, thereby achieving a higher memory clock frequency speed. Because the output impedance and the resistance value of a ODT resistor will change with a manufacturing process, an application environment such as voltage, temperature and other factors, it is necessary to calibrate the output impedance and the ODT resistor by means of ZQ calibration. Specifically, a port, i.e., a ZQ port, is provided on the DRAM memory. One end of the ZQ port is connected to the memory chip, and the other end is connected to an external resistor, i.e., a 240-ohm low-tolerance reference resistor. The output impedance and the ODT resistor are calibrated through an on-chip ZQ calibrator. After a system sends out a ZQ calibration command, the on-chip ZQ calibrator calibrates the output impedance and the ODT resistor according to a specified ZQ calibration cycle.

The ZQ calibrator may perform a ZQ calibration operation in response to a ZQ calibration enable signal to generate a ZQ calibration code. For example, if the ZQ calibration enable signal is enabled, the ZQ calibrator can perform a ZQ calibration operation to generate a ZQ calibration code, and the output impedance and the ODT resistor are calibrated through the ZQ calibration code, so that the impedance between the memory and an external device is matched, thereby improving signal quality during data reading and writing. Because the ZQ calibration is to calibrate the output impedance and the ODT resistor in the current process of the chip, the ZQ calibration code can reflect the information of the current process.

Because the ZQ calibration code increases with the change of the process, and the control signal is obtained by dividing the coefficient by the ZQ calibration code, the target value represented by the control signal decreases with the change of the process. Moreover, the cycle of the clock signal increases with the change of the process. Specifically, different chips on a same wafer or a same batch of wafers may have different process corners, and therefore, the frequencies/cycles of the clock signals of these chips with different process corners will be different, and the ZQ calibration code used for calibrating the output impedance and the ODT resistor will also be different. In the embodiments of the present disclosure, such a difference caused by different process corners is called as a change with a process. In this way, the target duration determined based on the target value represented by the control signal and the cycle of the clock signal will not change significantly with the change of the process. The change of the process is a change from an FF process corner to an SS process corner.

In the embodiments of the present disclosure, the pulse width of the target signal is adjusted by using the change of the ZQ calibration code with the process and the change of the clock signal with the process to control the pulse width of the target signal within a certain range, so as to reduce or eliminate the change of the pulse width of the target signal with the process, thereby stabilizing the pulse width of the target signal.

Figure 4:
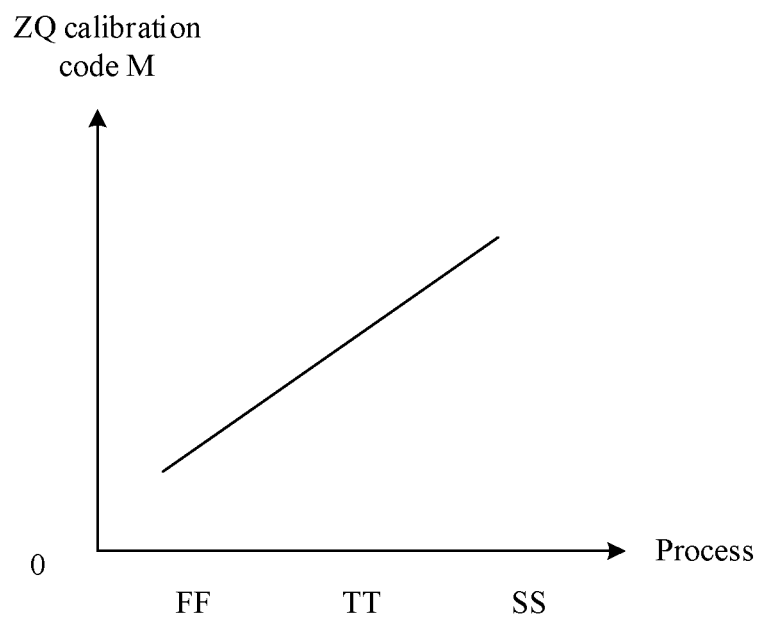
FIG. 4 is a trend diagram of the change of a ZQ calibration code with a process provided by embodiments of the present disclosure.

In a specific implementation, when the signal generation circuit is applied to a DDR4 chip, the ZQ calibrator 321 is configured to output a ZQ calibration code; and the arithmetic unit 322 is configured to receive the ZQ calibration code M, divide a coefficient N by the ZQ calibration code M and then output as the control signal. FIG. 4 is a trend diagram of the change of a ZQ calibration code with a process provided by embodiments of the present disclosure. The ZQ calibration code M is used for calibrating the output impedance and the ODT resistor, the ZQ calibration code M increases with the change of the process, therefore, the trend of the change of the target value represented by the control signal with the process is opposite to the trend of the change of the cycle of the clock signal with the process, and therefore, the control signal generated based on the ZQ calibration code M can effectively compensate for the change of the pulse width of the target signal with the process.

Here, the coefficient N is divided by the ZQ calibration code M to convert the ZQ calibration code M into a signal that decreases with the change of the process, and therefore, the trend of the change of the target value represented by the control signal with the process is opposite to the trend of the change of the cycle of the clock signal with the process. In actual application, the corresponding coefficient N can be selected according to the actual pulse width of the target signal. Here, the stage of a counter is a target value N/M represented by the control signal. In the embodiments of the present disclosure, the ZQ calibration code M increases with the change of the process, so that the target value N/M represented by the control signal decreases with the change of the process. The change of the process is a change from an FF process corner to an SS process corner.

Here, the control signal is a counter stage selection signal of the counter, and the counter can determine its stage according to the control signal, so as to perform counting based on the stage.

In the embodiments of the present disclosure, the flag signal is a check flag signal, and the check flag signal is used for representing a parity check error or a redundancy check error.

In the embodiments of the present disclosure, the generation module 330 includes a counter. When the flag signal changes from the first level to the second level, the counter starts to count the clock signal, and when a count value reaches the target value represented by the control signal, controls the target signal to change from the fourth level to the third level. When the flag signal is used for representing a parity check error, after a parity check error occurs, the flag signal PAR_Error_Flag is output. The flag signal PAR_Error_Flag is valid at a high level, so that when the flag signal PAR_Error_Flag changes from a low level to a high level, the generation module controls the target signal from a low level to a high level. Meanwhile, the counter starts to count the clock signal, and when the count value reaches the target value represented by the control signal, controls the target signal to change from the high level to the low level.

In some embodiments, the flag signal is used for representing a parity check error. After a parity check error occurs, the check flag signal PAR_Error_Flag is output. Then the target signal generated by the generation module is a parity check alert signal ALERT. Therefore, the pulse width tPAR_ALERT_PW of the parity check alert signal can be adjusted through the signal generation circuit provided by the embodiments of the present disclosure to control the pulse width tPAR_ALERT_PW of the parity check alert signal within a certain range, so as to reduce or eliminate the change of the pulse width tPAR_ALERT_PW of the parity check alert signal with the process, thereby stabilizing the pulse width tPAR_ALERT_PW of the parity check alert signal within the range specified by the SPEC.

It should be noted that the ALERT signal here is not a signal that is finally output through an alert_n pin, and the ALERT signal needs to pass through several inverters or output buffer circuits before it is output to the alert_n pin of the chip. In a specific example, the ALERT signal can be output to the alert_n pin of the chip after passing through an odd number of inverters, so as to ensure that the alert_n signal output by the alert_n pin is valid at a low level.

Here, the stage of the counter is the target value N/M represented by the control signal. If the cycle of the clock signal is T, the target duration (the pulse width of the target signal) is T×N/M. The trends of the changes of N/M and T with the process are opposite. Therefore, the target duration (the pulse width of the target signal) hardly changes with the change of the process, in other words, the target duration (the pulse width of the target signal) is stabilized within the range specified by the SPEC in different processes. The change of the process is a change from an FF process corner to an SS process corner.

Figure 5:
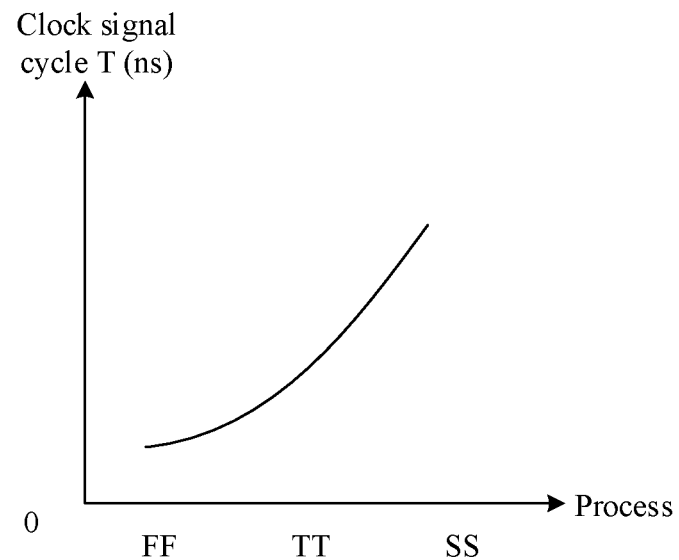
FIG. 5 is a trend diagram of the change of the cycle of a clock signal with a process provided by embodiments of the present disclosure.
Figure 6:
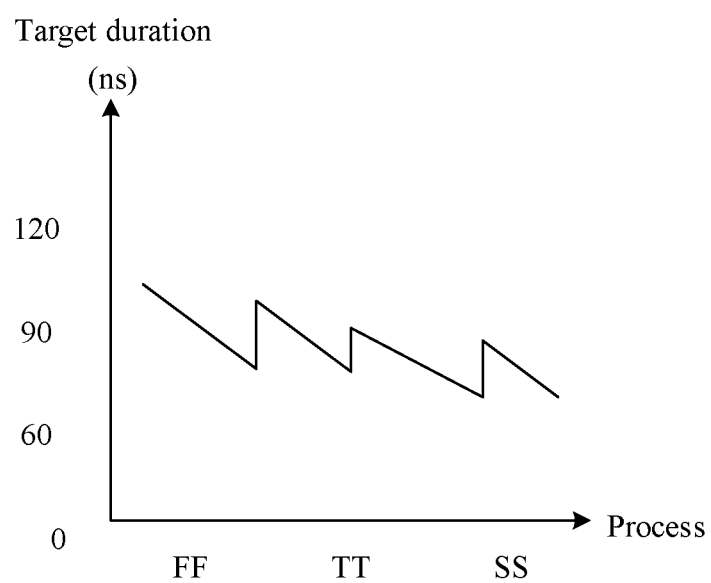
FIG. 6 is a trend diagram of the change of a target duration with a process provided by embodiments of the present disclosure.

FIG. 5 is a trend diagram of the change of the cycle of a clock signal with a process provided by embodiments of the present disclosure. FIG. 6 is a trend diagram of the change of a target duration with a process provided by embodiments of the present disclosure. In FIG. 5, the ordinate is the cycle of the clock signal, and the abscissa is the process. In FIG. 6, the ordinate is a target duration, and the abscissa is the process. As shown in FIG. 4, FIG. 5, and FIG. 6, the cycle of the clock signal T increases with the change of the process, and the ZQ calibration code M increases with the change of the process, so that the target value N/M represented by the control signal decreases with the change of the process, and then the target duration T×N/M obtained based on the cycle of the clock signal T and the target value N/M represented by the control signal can be stabilized within the range specified by the SPEC in the case of the change of the process.

Figure 7:
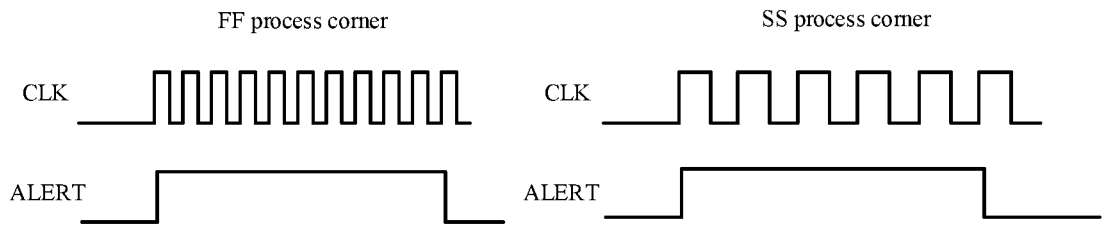
FIG. 7 is a schematic diagram of the pulse width of a ALERT signal in different processes.

FIG. 7 is a schematic diagram of the pulse width of a ALERT signal in different processes. The ALERT signal in FIG. 7 is generated based on the signal generation circuit provided by the embodiments of the present disclosure. As shown in FIG. 7, in an FF process corner, the cycle T of a clock signal CLK generated by a ring oscillator is relatively small, but a target value N/M (the stage of a counter) represented by a control signal is relatively large. In an SS process corner, the cycle T of the clock signal CLK generated by the ring oscillator is relatively large, but the target value N/M (the stage of the counter) represented by the control signal is relatively small. Therefore, the pulse width of the finally output ALERT signal does not change much in an FF process corner and an SS process corner. That is, under the joint control of the clock signal and the control signal, the pulse width of the target signal can be controlled within a certain range, so as to reduce or eliminate the change of the pulse width of the target signal with the process, thereby stabilizing the pulse width of the target signal within the range specified by the SPEC.

In the embodiments of the present disclosure, the first level is a low level, the second level is a high level, the third level is a low level, and the fourth level is a high level. Then when the flag signal changes from a low level to a high level, the target signal changes from a low level to a high level, and after being maintained at the high level for a target duration, the target signal changes from the high level to the low level. Here, if the flag signal is a check flag signal, the check flag signal is valid at the high level. When the check flag signal is at the high level, it is indicated that a check error has occurred; and when the check flag signal is at the low level, it is indicated that no check error has occurred. In the embodiments of the present disclosure, the target duration is determined according to the cycle of the clock signal and the target value represented by the control signal, and the trends of the changes of the cycle of the clock signal and the target value represented by the control signal with the process are opposite. Therefore, the target duration (the pulse width of the target signal) hardly changes with the change of the process, in other words, the target duration (the pulse width of the target signal) remains stable in different processes.

Figure 8:
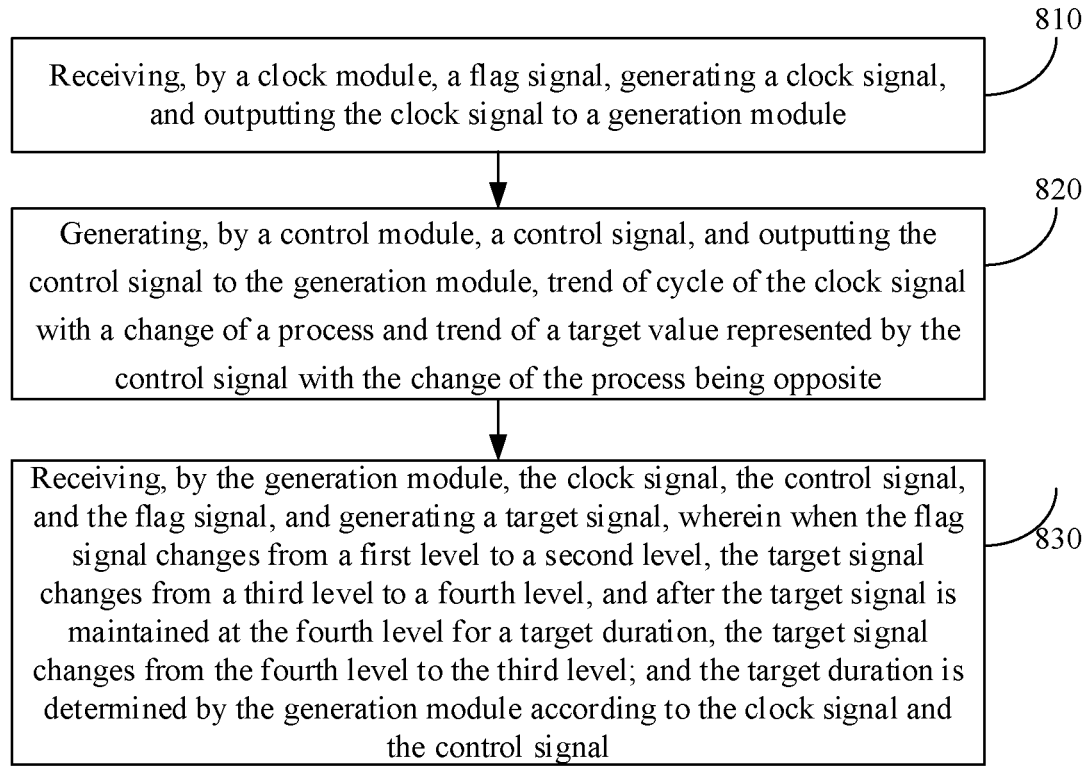
FIG. 8 is a schematic flowchart of implementation of a signal generation method provided by embodiments of the present disclosure.

Based on the same technical concept as the foregoing signal generation circuit, embodiments of the present disclosure provide a signal generation method. FIG. 8 is a schematic flowchart of implementation of a signal generation method provided by embodiments of the present disclosure. As shown in FIG. 8, the method mainly includes the following steps.

At step 810, a flag signal is received by a clock module, a clock signal is generated, and the clock signal is output to a generation module.

At step 820, a control signal is generated by a control module, and the control signal is output to the generation module, trend of a change of cycle of the clock signal with a process and trend of a change of a target value represented by the control signal with the process being opposite.

At step 830, the clock signal, the control signal, and the flag signal are received by the generation module, and a target signal is generated, wherein when the flag signal changes from a first level to a second level, the target signal changes from a third level to a fourth level, and after the target signal is maintained at the fourth level for a target duration, the target signal changes from the fourth level to the third level; and the target duration is determined by the generation module according to the clock signal and the control signal.

Here, the target duration in which the target signal output by the generation module is maintained at the fourth level is the pulse width of the target signal output by the generation module.

In the embodiments of the present disclosure, step 810 includes: when the flag signal changes from the first level to the second level, generating, by the ring oscillator, the clock signal. In the embodiments of the present disclosure, the ring oscillator is used to generate the clock signal as an internal clock signal.

In the embodiments of the present disclosure, the trends of the changes of the target value represented by the control signal and the cycle of the clock signal with the process are opposite, so that the target duration determined according to the clock signal and the control signal will not be affected by the process, so that the pulse width of the target signal is stable.

Further, in the embodiments of the present disclosure, the pulse width of the target signal is adjusted through the clock signal and the control signal to control the pulse width of the target signal within a certain range, so as to reduce or eliminate the change of the pulse width of the target signal with the process, thereby stabilizing the pulse width of the target signal.

In the embodiments of the present disclosure, the flag signal is a check flag signal, and the check flag signal is used for representing a parity check error or a redundancy check error.

In the embodiments of the present disclosure, step 820 includes: performing, by a ZQ calibrator, a ZQ calibration operation, and outputting a ZQ calibration code used for calibrating output impedance; and receiving, by the arithmetic unit, the ZQ calibration code, dividing a coefficient by the ZQ calibration code and outputting a division result as the control signal.

Because the ZQ calibration code increases with the change of the process, and the control signal is obtained by dividing the coefficient by the ZQ calibration code, the target value represented by the control signal decreases with the change of the process. Moreover, the cycle of the clock signal increases with the change of the process. In this way, the target duration determined based on the target value represented by the control signal and the cycle of the clock signal will not change significantly with the change of the process. The change of the process is a change from an FF process corner to an SS process corner.

Here, the coefficient N is divided by the ZQ calibration code M to convert the ZQ calibration code M into a signal that decreases with the change of the process, and therefore, the trend of the change of the target value represented by the control signal with the process is opposite to the trend of the change of the cycle of the clock signal with the process. In actual application, the corresponding coefficient N can be selected according to the actual pulse width of the target signal. Here, the stage of a counter is a target value N/M represented by the control signal. In the embodiments of the present disclosure, the ZQ calibration code M increases with the change of the process, so that the target value N/M represented by the control signal decreases with the change of the process. The change of the process is a change from an FF process corner to an SS process corner.

In the embodiments of the present disclosure, the wherein when the flag signal changes from a first level to a second level, the target signal changes from a third level to a fourth level, after the target signal is maintained at the fourth level for a target duration, the target signal changes from the fourth level to the third level includes: when the flag signal changes from the first level to the second level, counting, by a counter, the clock signal, and when a count value reaches the target value represented by the control signal, controlling, by the counter, the target signal to change from the fourth level to the third level.

Here, the stage of the counter is the target value N/M represented by the control signal. If the cycle of the clock signal is T, the target duration (the pulse width of the target signal) is T×N/M. The trends of the changes of N/M and T with the process are opposite. Therefore, the target duration (the pulse width of the target signal) hardly changes with the change of the process, in other words, the target duration (the pulse width of the target signal) remains stable in different processes.

In the embodiments of the present disclosure, the first level is a low level, the second level is a high level, the third level is a low level, and the fourth level is a high level.

Embodiments of the present disclosure further provide a semiconductor memory, including the forgoing signal generation circuit. The semiconductor memory specified in the present disclosure includes, but is not limited to, a DRAM, etc. The semiconductor memory can use the signal generation circuit of the present disclosure to adjust the pulse width of a target signal generated thereby, so that the pulse width of the target signal is not affected by a process, and is stabilized within a certain range. In other words, the semiconductor memory can use the signal generation circuit of the present disclosure to adjust the pulse width of the target signal generated thereby, so that the pulse width of the target signal is not affected by a process corner thereof, and is stabilized within a certain range.

In the embodiments of the present disclosure, the DRAM chip conforms to a DDR4 memory specification.

The methods disclosed in the several method embodiments provided by the present disclosure can be arbitrarily combined without conflicts to obtain new method embodiments.

The features disclosed in the several apparatus embodiments provided by the present disclosure can be arbitrarily combined without conflicts to obtain new apparatus embodiments.

The descriptions above are only specific implementations of the present disclosure. However, the scope of protection of the present disclosure is not limited thereto. Any change or substitution that could be easily conceived of by those skilled in the art within the technical scope disclosed by the present disclosure should all fall within the scope of protection of the present disclosure. Therefore, the scope of protection of the present disclosure shall be subject to the scope of protection of the claims.

What is claimed is:

1. A signal generation circuit, comprising:
   a clock circuit, configured to receive a flag signal and generate a clock signal;
   a control circuit, configured to generate a control signal, trend of a change of cycle of the clock signal with a process and trend of a change of a target value represented by the control signal with the process being opposite; and
   a generation circuit, connected to both the clock circuit and the control circuit, and configured to receive the clock signal, the control signal, and the flag signal and generate a target signal, wherein when the flag signal changes from a first level to a second level, the target signal changes from a third level to a fourth level, and after the target signal is maintained at the fourth level for a target duration, the target signal changes from the fourth level to the third level; and the generation circuit is further configured to determine the target duration according to the clock signal and the control signal.

2. The signal generation circuit of claim 1, wherein the generation circuit comprises a counter; when the flag signal changes from the first level to the second level, the counter starting to count the clock signal; and when a count value reaches the target value represented by the control signal, the target signal is controlled to change from the fourth level to the third level.

3. The signal generation circuit of claim 1, wherein the clock circuit comprises a ring oscillator; and when the flag signal changes from the first level to the second level, the ring oscillator generates the clock signal.

4. The signal generation circuit of claim 1, wherein the first level is a low level, the second level is a high level, the third level is a low level, and the fourth level is a high level.

5. The signal generation circuit of claim 1, wherein the flag signal is a check flag signal, and the check flag signal is used for representing a parity check error or a redundancy check error.

6. The signal generation circuit of claim 1, wherein
the cycle of the clock signal increases with change of the process, and the target value represented by the control signal decreases with the change of the process; and
the change of the process is a change from an FF process corner to an SS process corner.

7. The signal generation circuit of claim 1, wherein the control circuit comprises a ZQ calibrator and an arithmetic unit, wherein
the ZQ calibrator is configured to perform a ZQ calibration operation and output a ZQ calibration code used for calibrating output impedance; and
the arithmetic unit is configured to receive the ZQ calibration code, divide a coefficient by the ZQ calibration code and output a division result as the control signal.

8. The signal generation circuit of claim 7, wherein
the ZQ calibration code increases with the change of the process; and
wherein the change of the process is a change from an FF process corner to an SS process corner.

9. A signal generation method, comprising:
receiving, by a clock circuit, a flag signal and generating a clock signal, and outputting the clock signal to a generation circuit;
generating, by a control circuit, a control signal, and outputting the control signal to the generation circuit, trend of a change of cycle of the clock signal with a process and trend of a change of a target value represented by the control signal with the process being opposite; and
receiving, by the generation circuit, the clock signal, the control signal, and the flag signal, and generating a target signal, wherein when the flag signal changes from a first level to a second level, the target signal changes from a third level to a fourth level, and after the target signal is maintained at the fourth level for a target duration, the target signal changes from the fourth level to the third level; and the target duration is determined by the generation circuit according to the clock signal and the control signal.

10. The signal generation method of claim 9, wherein receiving, by the clock circuit, the flag signal and generating the clock signal comprises:
receiving, by a ring oscillator, the flag signal, when the flag signal changes from the first level to the second level, the ring oscillator generates the clock signal.

11. The signal generation method of claim 9, wherein the wherein when the flag signal changes from a first level to a second level, the target signal changes from a third level to a fourth level, and after the target signal is maintained at the fourth level for a target duration, the target signal changes from the fourth level to the third level comprises:
when the flag signal changes from the first level to the second level, counting, by a counter, the clock signal, and when a count value reaches the target value represented by the control signal, controlling, by the counter, the target signal to change from the fourth level to the third level.

12. The signal generation method of claim 9, wherein the first level is a low level, the second level is a high level, the third level is a low level, and the fourth level is a high level.

13. The signal generation method of claim 9, wherein the flag signal is a check flag signal, and the check flag signal is used for representing a parity check error or a redundancy check error.

14. The signal generation method of claim 9, wherein
the cycle of the clock signal increases with a change of the process, and the target value represented by the control signal decreases with the change of the process; and
the change of the process is a change from an FF process corner to an SS process corner.

15. The signal generation method of claim 9, wherein generating, by the control circuit, the control signal that compensates for the clock signal which varies with the process comprises:
performing, by a ZQ calibrator, a ZQ calibration operation, and outputting a ZQ calibration code used for calibrating output impedance; and
receiving, by an arithmetic unit, the ZQ calibration code, dividing a coefficient by the ZQ calibration code and outputting a division result as the control signal.

16. The signal generation method of claim 15, wherein
the ZQ calibration code increases with the change of the process; and
wherein the change of the process is a change from an FF process corner to an SS process corner.

17. A semiconductor memory, comprising a signal generation circuit, wherein the signal generation circuit comprises:
a clock circuit, configured to receive a flag signal and generate a clock signal;
a control circuit, configured to generate a control signal, trend of a change of cycle of the clock signal with a process and trend of a change of a target value represented by the control signal with the process being opposite; and
a generation circuit, connected to both the clock circuit and the control circuit, and configured to receive the clock signal, the control signal, and the flag signal and generate a target signal, wherein when the flag signal changes from a first level to a second level, the target signal changes from a third level to a fourth level, and after the target signal is maintained at the fourth level for a target duration, the target signal changes from the fourth level to the third level; and the generation circuit is further configured to determine the target duration according to the clock signal and the control signal.

18. The semiconductor memory of claim 17, wherein the generation circuit comprises a counter; when the flag signal changes from the first level to the second level, the counter starting to count the clock signal; and when a count value reaches the target value represented by the control signal, the target signal is controlled to change from the fourth level to the third level.

19. The semiconductor memory of claim 17, wherein the semiconductor memory is a Dynamic Random-Access Memory (DRAM) chip.

20. The semiconductor memory of claim 19, wherein the memory of the DRAM chip conforms to a DDR4 memory specification.

* * * * *